United States Patent
Ito et al.

(10) Patent No.: US 8,395,264 B2
(45) Date of Patent: Mar. 12, 2013

(54) SUBSTRATE COMPRISING ALLOY FILM OF METAL ELEMENT HAVING BARRIER FUNCTION AND METAL ELEMENT HAVING CATALYTIC POWER

(75) Inventors: Junichi Ito, Kitaibaraki (JP); Junnosuke Sekiguchi, Kitaibaraki (JP); Toru Imori, Kitaibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 12/998,802

(22) PCT Filed: Jan. 28, 2010

(86) PCT No.: PCT/JP2010/051103
§ 371 (c)(1),
(2), (4) Date: Jun. 2, 2011

(87) PCT Pub. No.: WO2010/087392
PCT Pub. Date: Aug. 5, 2010

(65) Prior Publication Data
US 2011/0241209 A1    Oct. 6, 2011

(30) Foreign Application Priority Data
Jan. 30, 2009    (JP) .................................. 2009-019471

(51) Int. Cl.
*H01L 23/48*    (2006.01)
(52) U.S. Cl. ................. 257/751; 257/774; 257/E23.016; 257/E21.584; 438/627; 438/643; 438/653
(58) Field of Classification Search .................. 257/751, 257/E23.584, 774, E23.016, E21.584; 438/653, 438/627, 637, 643
See application file for complete search history.

(56) References Cited

U.S. PATENT DOCUMENTS

| | | | | |
|---|---|---|---|---|
| 6,387,800 | B1* | 5/2002 | Liu et al. | 438/653 |
| 6,559,546 | B1* | 5/2003 | Achuthan et al. | 257/758 |
| 2002/0132468 | A1* | 9/2002 | Wong | 438/627 |

FOREIGN PATENT DOCUMENTS

| | | |
|---|---|---|
| JP | 2000-012544 | 1/2000 |
| JP | 2000-183003 | 6/2000 |
| JP | 2003-309181 | 10/2003 |

(Continued)

OTHER PUBLICATIONS

Korean Office Action dated Oct. 12, 2012, with Concise Explanation of Relevance (5 pages).

*Primary Examiner* — Jasmine Clark
(74) *Attorney, Agent, or Firm* — Flynn, Thiel, Boutell & Tanis, P.C.

(57) ABSTRACT

A layer having a barrier function and catalytic power and excelling in formation uniformity and coverage of an ultrathin film, a pretreatment technique making it possible to form an ultrafine wiring and form a thin seed layer of uniform film thickness and a substrate including a thin seed layer formed with a uniform film thickness by electroless plating by using the aforementioned technique. A substrate in which an alloy film of one or more metal elements, having a barrier function and a metal element or metal elements, having catalytic power with respect to electroless plating is formed by chemical vapor deposition (CVD) on a base to a film thickness of 0.5 nm to 5 nm with a content ratio of the one or more metal element having a barrier function from 5 to 90 at. %.

10 Claims, 1 Drawing Sheet

FOREIGN PATENT DOCUMENTS

| | | |
|---|---|---|
| JP | 2004-115885 | 4/2004 |
| JP | 2006-513325 | 4/2006 |
| JP | 2008-205330 | 9/2008 |
| JP | 2008-538591 | 10/2008 |
| WO | WO 2004/068576 | 8/2004 |
| WO | WO 2005-038086 | 4/2005 |

* cited by examiner

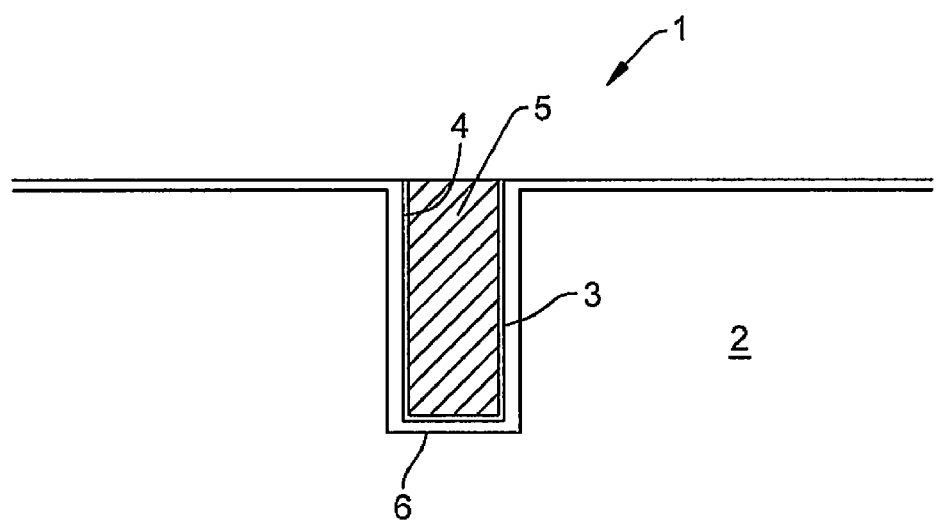

SUBSTRATE COMPRISING ALLOY FILM OF METAL ELEMENT HAVING BARRIER FUNCTION AND METAL ELEMENT HAVING CATALYTIC POWER

TECHNICAL FIELD

The present invention relates to a substrate comprising an alloy film of a metal element having a barrier function and a metal element having catalytic power, formed on a base.

More particularly, the present invention relates to a substrate having formed thereon an alloy film of a metal element having a barrier function and a metal element having catalytic power as a catalyst layer for forming a seed layer by electroless plating when an ULSI ultrafine copper wiring (damascene copper wiring) is formed.

BACKGROUND ART

A method for providing a copper seed layer by electroless plating and then forming copper film by electroplating copper is known as a method for forming an ULSI ultrafine copper wiring (damascene copper wiring).

When electroless copper plating is performed on a mirror finish surface such as a semiconductor wafer, the reactivity of the plating is low and uniform plating is difficult to perform over the entire substrate surface. For this reason, for example, a catalytic metal layer is provided on a barrier metal layer such as tantalum nitride and then a copper seed layer is formed by an electroless plating method.

When a barrier layer for preventing the diffusion of copper and a catalytic metal layer are formed and then a copper seed layer is provided by electroless plating in such a method, that is, in damascene copper wiring formation, a two-layer structure of the barrier layer and catalytic metal layer is formed before the copper seed layer is formed. The resultant problem is that such a method is difficult to apply to an actual process when ultrafine wiring, which is not allowed to have a thick film, is required.

As for the barrier layer, for example, Patent Document 1 describes using a molybdenum-tungsten alloy film as a barrier layer for metal electrodes. By using a molybdenum-tungsten alloy film as a barrier layer, it is possible to prevent the electric resistance from raising in a high-temperature process and form the necessary circuit by dry etching. Both the molybdenum and the tungsten are metals having a barrier function and differ from the catalyst layer provided to form a seed layer by electroless plating.

Patent Document 2 indicates that ruthenium present on a substrate (Si or $SiO_2$) demonstrates excellent barrier ability. Further, it is also indicated that the ruthenium layer has an excellent feature of making it possible to directly deposit copper by plating, without providing a PVD copper seed layer on the ruthenium layer. However, at the same time, it is also indicated that the bonding strength of the ruthenium layer to the substrate degrades to an unacceptable level. In order to resolve this problem, the aforementioned patent document discloses a ruthenium alloy that can be used for vapor deposition and atomic layer deposition (ALD), but a material that has been actually investigated in detail with respect to film formation on the substrate and specifically disclosed in the document is a laminated material including a ruthenium layer. Thus, specifically suggested as a barrier structure that resolves the aforementioned problem, has good barrier strength, and enables direct electrochemical plating of copper is a laminated material provided with at least one layer including a ruthenium-containing material or a ruthenium alloy and one layer including at least one element selected from groups IV, V, and VI of the periodic table of the elements or a combination of such elements. Specific examples include laminated materials such as TiZr/Ru, TiZrN/Ru, and TaN/Ru in which a ruthenium layer is used as the layer including the ruthenium-containing material or a ruthenium alloy. The only specific explanation relating to a ruthenium alloy is the description (paragraph [0017]) thereof as a component constituting a sputtering target.

PRIOR ART DOCUMENTS

Patent Documents

Patent Document 1: Japanese Patent Application Publication No. 2003-309081
Patent Document 2: Japanese Translation of PCT Application No. 2008-538591

DISCLOSURE OF THE INVENTION

Problems that the Invention is to Solve

It is an object of the present invention to eliminate the complication associated with the formation of the aforementioned two layers prior to the formation of the copper seed layer, provide a layer having a barrier function and catalytic power and excelling in formation uniformity and coverage of an ultrathin film, provide a pretreatment technique making it possible to form an ultrafine wiring and form a thin seed layer of uniform film thickness, provide a substrate including a thin seed layer formed with a uniform film thickness by electroless plating by using the aforementioned technique, and provide a method for manufacturing such a substrate.

Means for Solving the Problems

The inventors have conducted a comprehensive research and the results obtained demonstrated that a layer having a barrier function and catalytic power and excelling in formation uniformity and coverage, even at a film thickness of 0.5 nm to 5 nm, can be obtained by forming by chemical vapor deposition (CVD) an alloy film including a metal element having a barrier function, such as tungsten, and a metal element having catalyst power with respect to electroless plating, such as ruthenium. This finding led to the creation of the present invention.

The present invention will be described below.

(1) A substrate in which an alloy film of one or more metal elements, having a barrier function, selected from among tungsten, molybdenum and, niobium and a metal element or metal elements, having catalytic power with respect to electroless plating, composed of ruthenium and/or platinum is formed by chemical vapor deposition (CVD) on a base to a film thickness of 0.5 nm to 5 nm in a composition with a content ratio of the one or more metal elements having a barrier function of equal to or greater than 5 at. % and equal to or less than 90 at. %.

(2) The substrate according to (1) above, wherein an alloy film of one or more metal elements, having a barrier function, selected from among tungsten, molybdenum, and niobium and a metal element, having catalytic power with respect to electroless plating, composed of ruthenium is formed by chemical vapor deposition (CVD) on the base to a film thickness of 0.5 nm to 5 nm in a composition with a content ratio of the one or more metal elements having a barrier function of equal to or greater than 5 at. % and equal to or less than 90 at. %.

(3) The substrate according to (1) above, wherein an alloy film of one or more metal elements, having a barrier function, selected from among tungsten, molybdenum, and niobium and a metal element or metal elements, having catalytic power with respect to electroless plating, composed of platinum or both of platinum and ruthenium is formed by chemical vapor deposition (CVD) on the base to a film thickness of 0.5 nm to 5 nm in a composition with a content ratio of the one or more metal elements having a barrier function of equal to or greater than 5 at. % and equal to or less than 90 at. %.

(4) The substrate according to any one of (1) to (3) above, wherein the alloy film is formed to a thickness of 1 nm to 3 nm.

(5) The substrate according to any one of (1) to (4) above, wherein the alloy film has a composition with a content ratio of the one or more metal elements having a barrier function of equal to or greater than 5 at. % and equal to or less than 80 at. %.

(6) The substrate according to any one of (1) to (5) above, wherein a copper seed layer formed by electroless copper plating using, as a catalyst, the metal element or metal elements having catalytic power is provided on the alloy film.

(7) The substrate according to any one of (1) to (6) above, wherein the substrate serves as a substrate to form a damascene copper wiring having via trenches with a wiring width of equal to or less than 50 nm and has the alloy film on the base or the copper seed layer on the alloy film.

(8) The substrate according to (6) above, wherein a damascene copper wiring is further formed on the copper seed layer.

(9) A method of manufacturing the substrate according to any one of (1) to (8) above, comprising forming an alloy film of one or more metal elements, having a barrier function, selected from among tungsten, molybdenum, and niobium and a metal element or metal elements, having catalytic power with respect to electroless plating, composed of ruthenium and/or platinum, by chemical vapor deposition (CVD), on a base to a film thickness of 0.5 nm to 5 nm in a composition with a content ratio of the one or more metal elements having a barrier function of equal to or greater than 5 at. % and equal to or less than 90 at. %.

(10) A semiconductor wafer using the substrate according to (7) or (8) above.

By forming an alloy film of one or more metal elements, having a barrier function, selected from among tungsten, molybdenum, and niobium and a metal element or metal elements, having catalytic power with respect to electroless plating, composed of ruthenium and/or platinum, by chemical vapor deposition, on a base in a composition with a content ratio of the one or more metal elements having a barrier function of equal to or greater than 5 at. % and equal to or less than 90 at. %, it is possible to produce the alloy film as a single layer combining the barrier function with catalytic power. Further, film uniformity and coverage in an ultrathin film with a thickness of 0.5 nm to 5 nm during formation of the alloy film can be improved over those obtained when the film is formed by a physical vapor deposition (PVD) method such as vacuum vapor deposition or sputtering, and a fine semiconductor wiring with a low electric resistance value can be formed.

BRIEF DESCRIPTION OF THE DRAWING

The FIGURE illustrates an embodiment of the present invention in which a via trench is provided in the base, an alloy film formed on the base, a copper seed layer provided on the alloy film and damascene copper wiring provided on copper seed layer in the via trench.

BEST MODE FOR CARRYING OUT THE INVENTION

The substrate in accordance with the present invention is obtained by forming an alloy film of one or more metal elements, having a barrier function, selected from among tungsten, molybdenum, and niobium and a metal element or metal elements, having catalytic power with respect to electroless plating, composed of ruthenium and/or platinum, by chemical vapor deposition (CVD), on a base to a film thickness of 0.5 nm to 5 nm in a composition with a content ratio of the one or more metal elements having a barrier function of equal to or greater than 5 at. % and equal to or less than 90 at. % when a thin metal film is formed by electroless plating.

Ruthenium and platinum have catalytic power with respect to a reaction in which a plating film is formed by reducing metal ions such as copper ions in an electroless plating solution. Tungsten, molybdenum, and niobium are metals having a barrier function with respect to metals such as copper, and by forming a thin alloy film of one or more metal elements, having a barrier function, selected from tungsten, molybdenum, and niobium and a metal element or metal elements, having catalytic power with respect to electroless plating, composed of ruthenium and/or platinum, it is possible to obtain a single layer combining a barrier function with catalytic power, and the difficulty of forming a two-layer structure including a barrier layer and a catalytic metal layer when forming a damascene copper wiring can be overcome.

Tungsten, molybdenum, and niobium can participate in substitution plating with metal ions contained in the electroless plating solution and the electroless plating performed when forming a seed layer by electroless plating on the aforementioned alloy film becomes electroless substitution and reduction plating and a uniform thin film can be obtained.

In the composition of the alloy film of one or more metal elements, having a barrier function, selected from tungsten, molybdenum, and niobium and a metal element or metal elements, having catalytic power with respect to electroless plating, composed of ruthenium and/or platinum, the content ratio of the one or more metal elements having a barrier function is equal to or greater than 5 at. % and equal to or less than 90 at. %, preferably equal to or greater than 5 at. % and equal to or less than 80 at. %, more preferably equal to or greater than 20 at. % and equal to or less than 80 at. %, and even more preferably equal to or greater than 50 at. % and equal to or less than 80 at. %. Where the content of the one or more metal elements having a barrier function is less than 5 at. %, the ratio of the one or more metal elements having a barrier function decreases and the barrier function is thereby weakened. Where the content of the one or more metal element having a barrier function is more than 90 at. %, the substitution reaction prevails over the reduction reaction of the plating solution, the material to be plated is eroded, a uniform thin film cannot be formed, and the adhesion of film decreases. Further, since an uneven film is formed, holes are produced in the electroless plating film surface, extremely thin portions are formed, and the barrier function is weakened. Further, in the catalytic reaction, a certain time is necessary to start the deposition, but in the substitution reaction, the deposition starts comparatively rapidly. Therefore, where the ratio of the metal element(s) having a barrier function is equal to or greater than 50 at. %, the ratio of substitution reaction at the initial stage of plating increases and the film-thickness reproducibility and uniformity of the obtained plating film are improved. In addition, if the ratio of the metal element(s) having a barrier function is increased, cost is substantially reduced.

Ruthenium demonstrates a poor adhesion to a base layer (Si, $SiO_2$), and the problem arising when a ruthenium layer is directly provided on the base is that the ruthenium layer is easily peeled off. However, since a ruthenium-containing alloy film is used with the above-described compositional ratio, the adhesion between the base and the thin alloy film is good and no problem is associated therewith.

Examples of preferred alloy films among alloy films of metal elements having a barrier function and metal elements having catalytic power include tungsten-ruthenium alloy films, molybdenum-ruthenium alloy films, tungsten-platinum alloy films, and niobium-platinum alloy films.

In accordance with the present invention, the alloy film is formed on the base by using the CVD method. By forming the alloy film by using the CVD method, it is possible to improve the coverage and film uniformity in an ultrathin film with a thickness of 0.5 nm to 5 nm over those obtained when the film is formed by a physical vapor deposition (PVD) method such as vacuum vapor deposition or sputtering, and a fine semiconductor wiring with a low electric resistance value can be formed.

A well-known method for forming an alloy film by CVD can be used as a method for forming the aforementioned alloy film by CVD. For example, a tungsten-ruthenium alloy film can be formed by using tris(acetylacetonato)ruthenium (II) or the like as a ruthenium source, using tungsten fluoride or the like as a tungsten source, and evaporating the ruthenium source and tungsten source in an inert gas such as argon. It is also possible to use niobium pentachloride ($NbCl_5$) or the like as a niobium source, molybdenum pentachloride ($MoCl_5$) or the like as a molybdenum source, and $(PtCl_2)_2(CO)_3$ or the like as a platinum source and form an alloy film in a similar manner.

The alloy film of a desired composition can be obtained by adjusting the amount of the source of the metal element having a catalytic power and the amount of the source of the metal element having a barrier function.

The thickness of the alloy film is preferably 0.5 nm to 5 nm, more preferably 1 nm to 3 nm. Where the thickness of the alloy film is greater than 5 nm, in a fine damascene wiring with a line width of equal to or less than 50 nm, the remaining space is reduced, the wiring is reduced in size, and the electric resistance of the wiring is increased.

A thin metal film (seed layer) formed by electroless substitution and reduction plating by using the alloy film as a catalyst layer is formed as a result of a process in which metal ions contained in the electroless plating solution are deposited as a metal due to a substitution reaction of metal ions contained in the electroless plating solution and the metal element having a barrier function, such as tungsten, and because the metal element having catalytic power, such as ruthenium, acts as a catalyst that reduces metal ions contained in the electroless plating solution. Examples of the thin metal film include thin films composed of at least one metal selected from gold, silver, copper, nickel, cobalt, iron, and tin, a thin film of copper or an alloy including copper as the main component is preferred, and a thin copper film is especially preferred.

In the electroless plating, substitution plating removes oxides present on the surface of the alloy film in the substitution plating process and, at the same time, reduction plating is induced, thereby making it possible to thinly and uniformly form a seed layer having the desired electric conductivity and required film thickness.

As a result, it is possible to decrease the thickness of the seed layer to a value equal to or less than 10 nm and obtain a resistivity of equal to or lower than 10 $\mu\Omega \cdot cm$. The decreased thickness of the seed layer enables applications to damascene copper wirings with a line width of equal to or less than 50 nm.

As a result of the abovementioned effects, it is possible to obtain the content of oxygen that is equal to or less than 1 at. % (equal to or below the detection limit; determined by analysis by Auger electron spectroscopy (AES)) at the interface of the aforementioned alloy film and the thin metal film formed by electroless substitution and reduction plating of copper or the like. By contrast, when tantalum demonstrating no substitution plating is used as the metal having a barrier ability, a significant amount of oxygen is detected in the interface.

The presence of oxygen in the interface produces such adverse effects as the increase in the resistance of the wiring or degradation of barrier function.

A semiconductor substrate such as a silicon wafer is preferred as the base for forming the alloy film in accordance with the present invention, and the base can be cleaned and the wetting ability thereof can be improved by performing acid treatment, alkali treatment, surfactant treatment, ultrasound cleaning, or combinations thereof.

A commonly used electroless plating procedure can be used when performing electroless substitution and reduction plating employing the alloy film in accordance with the present invention. Likewise, a commonly used plating solution can be also used.

The electroless plating is preferably an electroless copper plating. The metal element having catalytic power, such as ruthenium, has catalytic activity with respect to electroless copper plating, the metal element having a barrier function, such as tungsten, can participate in substitution plating with copper ions contained in the electroless copper plating solution and has barrier properties. It is preferred that a copper seed layer be formed on the alloy film by a combination of a reduction reaction of the electroless copper plating solution and a substitution reaction with copper ions contained in the electroless copper plating solution.

The electroless copper plating solution usually includes copper ions, a complex agent for copper ions, a reducing agent, and a pH adjusting agent, etc.

With consideration for the adverse effect produced by formalin on humans and environment, it is preferred that glyoxylic acid be used as the reducing agent of the electroless copper plating solution. Further, phosphinic acid demonstrates no reduction action on copper, but demonstrates strong reduction action upon a catalytic metal such as ruthenium. Therefore, phosphinic acid has an effect of increasing the initial plating reactivity via the catalytic metal. These compounds do not contain sodium, which is an impurity to be avoided in semiconductor applications.

Accordingly, it is more preferred that glyoxylic acid and phosphinic acid be used simultaneously as a reducing agent. Such combined use of glyoxylic acid and phosphinic acid increases plating reactivity with respect to that in the case when glyoxylic acid alone is used. As a result, it is possible to obtain an electroless copper plating solution that enables uniform plating at a lower temperature on a mirror finished surface such as that of semiconductor wafers on which a plating reaction is difficult to induce. High plating reactivity makes it possible to perform plating at a lower temperature, so that the solution stability is improved and finer and uniform copper particles are deposited.

The concentration of glyoxylic acid in the plating solution is preferably 0.005 mol/L to 0.5 mol/L, more preferably 0.01 mol/L to 0.2 mol/L. Where the concentration is less than 0.005 mol/L, the plating reaction does not occur, and where the concentration is higher than 0.5 mol/L, the plating solution becomes unstable and decomposes.

The concentration of phosphinic acid in the plating solution is preferably 0.001 mol/L to 0.5 mol/L, more preferably 0.005 mol/L to 0.2 mol/L. Where the concentration is less than 0.001 mol/L, the aforementioned effect is not demonstrated, and where the concentration is higher than 0.5 mol/L, the plating solution becomes unstable and decomposes.

Any copper ion source that has generally been used can be used as the copper ion source for the electroless copper plating solution in accordance with the present invention. Examples of suitable copper ion sources include copper sulfate, copper chloride, and copper nitrate. Any complex agent that has generally been used can be used as the complex agent for copper ions. Examples of suitable complex agents include ethylenediaminetetraacetic acid and tartaric acid.

Additives that have generally been used in plating solutions, for example, 2,2'-bipyridine, polyethylene glycol, and potassium ferrocyanide, can be used as other additives.

The electroless copper plating solution in accordance with the present invention is preferably used at pH 10 to 14, more preferably at pH 12 to 13. The pH adjusting agents that have commonly been used, such as sodium hydroxide and potassium hydroxide, can be used as the aforementioned pH adjusting agent. When alkali metals such as sodium and potassium are wished to be avoided in semiconductor applications, tetramethyl ammonium hydroxide can be used.

From the standpoint of bath stability and deposition rate of copper, it is preferred that the electroless copper plating solution in accordance with the present invention be used at a bath temperature of 40° C. to 90° C.

When plating is performed by using the electroless copper plating solution in accordance with the present invention, the material to be plated is dipped into a plating bath. The material to be plated has been coated with the aforementioned alloy film.

The thickness of the thin metal film produced by the electroless substitution and reduction plating in accordance with the present invention is preferably 3 nm to 10 nm.

The thin metal film produced by the electroless substitution and reduction plating in accordance with the present invention has a small thickness and good thickness uniformity. Therefore, when such a thin metal film is formed as a seed layer for damascene copper wiring, the thin-film seed layer can be formed with a uniform film thickness even in fine via trenches with a wiring width of equal to or less than 50 nm. As a result, a semiconductor wafer that is free from defects such as voids and seams can be obtained.

In the substrate in accordance with the present invention, a wiring portion can be further provided by plating on the thin metal film formed by electroless plating. The plating can be electroplating or electroless plating. Where the wiring portion is directly provided on the alloy film, without providing the thin metal film by electroless plating, the flow of electric current is inhibited, so that defects such as voids is apt to occur. Therefore, it is preferred that the wiring portion be provided on the thin metal film.

The wiring portion is preferably from copper or an alloy containing copper as the main component, more preferably from copper. The electroplating copper solution is not particularly limited and can have a composition that has been generally used for embedding damascene copper wirings. For example, a solution including copper sulfate and sulfuric acid as the main components and also chlorine, polyethylene glycol, bis(3-sulfopropyl)disodium disulfide, and Janus green in very small amounts can be used. Further, a plating solution for copper wiring embedding, for example, described in the pamphlet of WO 2005-038086 can be also used as the electroless copper plating solution used for embedding.

The substrate in accordance with the present invention has a specific alloy film formed on the base and also has a thin metal film acting as a seed layer that is formed on the specific metal film by electroless substitution and reduction plating. As has already been mentioned hereinabove, the specific alloy film is a single layer provided with both the catalytic power and the barrier function. Therefore, it is not necessary to form a barrier layer with the usual film thickness of several tens of nanometers. Thus, in the substrate in accordance with the present invention, the alloy film can be a single layer provided with both the barrier function and the catalytic power and the film thickness can be decreased. Further, since the alloy film is formed by the CVD method, it is possible to obtain a film with a thickness of 0.5 nm to 5 nm that excels in coverage and film uniformity, and further the film thickness can be decreased.

In addition, since the seed layer is formed by electroless substitution and reduction plating, the thickness of the thin metal film acting as a seed layer can be reduced to a value equal to or less than 10 nm, and by forming a metal plating film constituting a wiring portion by the usual method on such a thin metal film, it is possible to obtain a semiconductor element that can be applied to damascene copper wiring with a line width of equal to or less than 50 nm. In addition, the resistivity of the thin metal film acting as the seed layer can be decreased to a value equal to or less than 10 μΩ·cm and therefore the formation of a uniform film at the initial stage of subsequent electroplating is facilitated.

As shown in the FIGURE, the substrate 1 can have a via trench 6 provided in the base 2, the alloy film 3 provided on the base 2, the copper seed layer 4 provided on the alloy film 3 and copper wiring 5 provided on the copper seed layer 4.

EXAMPLES

The present invention will be explained below on the basis of examples thereof, but the present invention is not limited to the examples.

Examples 1 to 6

An alloy film with a thickness of 2 nm that had the composition presented in Table 1 was produced by a CVD method on a Si wafer, and a thin copper plating film was formed by an electroless plating method on the alloy film. The composition of the alloy film that has been formed and the thickness of the thin copper plating film formed by electroless plating are shown in Table 1.

When the CVD method was implemented, the W—Ru alloy films of Examples 1 to 3 used tris(acetylacetonato) ruthenium (II) (represented hereinbelow by Ru(acac)$_3$) as a ruthenium source and tungsten fluoride (represented hereinbelow by WF$_6$) as a tungsten source.

Ru(acac)$_3$ was heated to 150° C. to 180° C. and evaporated under an argon atmosphere and then introduced into a reaction chamber via a mass flow controller. WF$_6$ was also introduced into the reaction chamber via a mass flow controller. A Si wafer serving as a base for forming an alloy film was fixed inside the reaction chamber and held at 600° C. with a high frequency induction furnace. The pressure inside the reaction chamber was maintained at $10^{-5}$ Pa with a turbomolecular pump up to the start of the source material gas introduction, and the evacuation was stopped simultaneously with the introduction of starting material gas. The W—Ru alloy films of desired compositions were obtained by changing the introduced amounts of $Ru(acac)_3$ and $WF_6$ with the mass flow controllers.

In Examples 4 to 6, the above-mentioned compounds were used as the ruthenium source and tungsten source, niobium pentachloride ($NbCl_5$) was used as a niobium source, molybdenum pentachloride ($MoCl_5$) was used as a molybdenum source and $(PtCl_2)_2(CO)_3$ was used as a platinum source, and alloy films were formed by the CVD method in the same manner as in Example 1 so as to obtain the alloy films of the compositions shown in Table 1.

The thickness and composition of the obtained alloy films were determined. The film thickness was checked by cross-sectional TEM observations. The composition was determined by AES depth profile measurements.

Formation of copper film by electroless plating was performed under the conditions of pH 12.5, 50° C.×30 to 40 sec by using the plating solution of the following composition.

Composition of electroless copper plating solution:

| | |
|---|---|
| Copper sulfate | 0.02 mol/L |
| Ethylenediaminetetraacetic acid | 0.21 mol/L |
| Glyoxylic acid | 0.03 mol/L |
| Phosphinic acid | 0.09 mol/L |
| 2,2'-bipyridyl | 20 mg/L |
| pH 12.5 (adjusted with potassium hydroxide) | |

The thickness of the thin plated copper film thus obtained, presence of pores with a diameter of equal to or greater than 10 nm, resistivity, presence of diffusion of copper into the alloy film, and state of the interface of the copper film and alloy film during plating were evaluated. The film thickness was checked by TEM observations. The presence of pores was checked by surface SEM observations. The resistivity was calculated on the basis of sheet resistance measurement results obtained by a four-probe method and film thickness measurement results obtained by cross-sectional TEM observations. The presence of copper diffusion and oxidation state of the interface were determined by AES depth profile measurements. The results are compiled in Table 1.

Further, after the aforementioned CVD alloy film and electroless plated thin copper film had been formed on a semiconductor substrate provided with a trench pattern having a line width of 45 nm and an aspect ratio of 4, a wiring was embedded by copper electroplating using the copper film as a seed layer.

The embedding of wiring by copper electroplating was performed by using the plating solution of the following composition at 25° C.×60 sec and a current density of 1 $A/dm^2$.

| | |
|---|---|
| Copper sulfate | 0.25 mol/L |
| Sulfuric acid | 1.8 mol/L |
| Hydrochloric acid | 10 mmol/L |

Small amount of additives (polyethylene glycol, bis(3-sulfopropyl)disodium disulfide, and Janus green)

The embedding ability in the trench portion with a line width of 45 nm was evaluated by cleavage-sectional SEM observations of the obtained plated copper film. The trench embedding ability was evaluated by determining the presence of voids and seams.

◯: voids and seams are not present
x: voids and seams are present

The adhesion of plated film was evaluated by a tape peeling test after the copper film has been electroplated. In the tape peeling test, a cellophane tape (CT-24, manufactured by Nichiban Co.) was pressed by a finger and bonded to the plating surface, the tape was peeled off, peeling of the plated film was checked, and the following determination was made.

◯: the plated film is not peeled off
x: the plated film is peeled off

The results are shown in Table 1.

Comparative Examples 1 to 4

Electroless copper plating, copper electroplating, and evaluation were performed in the same manner as in Example 1, except that the method for manufacturing the alloy film in Example 1 was changed to PVD, an alloy target was used, and the alloy film described in Table 1 was formed to obtain a film thickness of 2 nm on the front surface portion.

The results are shown in Table 1.

Comparative Example 5

The alloy film with a thickness of 2 nm was produced by a CVD method in the same manner as in Example 1 and electroless copper plating, copper electroplating, and evaluation were performed in the same manner as in Example 1, except that the composition of the alloy film in Example 1 was changed to that shown in Table 1.

The results are shown in Table 1.

TABLE 1

| | Composition (at %) | Amount of oxygen at interface of alloy film and thin plated copper film (at %) | Diffusion of copper | Presence of pores in thin plated copper film | Resistivity of thin plated copper film ($\mu\Omega \cdot cm$) | Thickness of thin plated copper film (nm) | Embedding ability in trench portions with line width of 45 nm | Tape peeling test |
|---|---|---|---|---|---|---|---|---|
| Example 1 | CVD-W (80) Ru (20) | <1 | Not occurred | No | 7.3 | 7 | ◯ | ◯ |
| Example 2 | CVD-W (50) Ru (50) | <1 | Not occurred | No | 6.5 | 7 | ◯ | ◯ |
| Example 3 | CVD-W (20) Ru (80) | <1 | Not occurred | No | 6 | 5 | ◯ | ◯ |

TABLE 1-continued

| | Composition (at %) | Amount of oxygen at interface of alloy film and thin plated copper film (at %) | Diffusion of copper | Presence of pores in thin plated copper film | Resistivity of thin plated copper film (μΩ·cm) | Thickness of thin plated copper film (nm) | Embedding ability in trench portions with line width of 45 nm | Tape peeling test |
|---|---|---|---|---|---|---|---|---|
| Example 4 | CVD-Mo (50) Ru (50) | <1 | Not occurred | No | 8.1 | 9 | ○ | ○ |
| Example 5 | CVD-Nb (50) Pt (50) | <1 | Not occurred | No | 8.4 | 8 | ○ | ○ |
| Example 6 | CVD-W (50) Pt (50) | <1 | Not occurred | No | 6.9 | 7 | ○ | ○ |
| Comparative Example 1 | PVD-W (80) Ru (20) | <1 | Occurred | Yes | 7.6 | 7 | x | ○ |
| Comparative Example 2 | PVD-Mo (50) Ru (50) | <1 | Occurred | Yes | 9.6 | 9 | x | ○ |
| Comparative Example 3 | PVD-Nb (50) Pt (50) | <1 | Occurred | Yes | 10.1 | 9 | x | ○ |
| Comparative Example 4 | PVD-W (50) Pt (50) | <1 | Occurred | Yes | 7.1 | 8 | x | ○ |
| Comparative Example 5 | CVD-W (95) Ru (5) | <1 | Not occurred | Yes | 12.3 | 13 | ○ | x |

What is claimed is:

1. A substrate comprising an alloy film of a thickness of from 0.5-5 nm formed by chemical vapor deposition on a base, the alloy film comprising at least one metal having a barrier function and at least one metal having a catalytic ability with respect to electroless plating, the at least one metal having a barrier function being selected from the group consisting of tungsten, molybdenum and niobium and the at least one metal having a catalytic ability being selected from the group consisting of ruthenium and platinum and the content of the at least one metal having a barrier function in the alloy film is 5-90 at. %.

2. The substrate according to claim 1, wherein the at least one metal having a catalytic ability is ruthenium.

3. The substrate according to claim 1, wherein the at least one metal having a catalytic ability is platinum or both of platinum and ruthenium.

4. The substrate according to claim 1, wherein the alloy film is formed to a thickness of 1 to 3 nm.

5. The substrate according to claim 1, wherein the content ratio of the at least one metal having a barrier function is from 5 to 80 at. %.

6. The substrate according to claim 1, additionally comprising a copper seed layer formed by electroless copper plating on the alloy film.

7. The substrate according to claim 6, wherein a damascene copper wiring is further formed on the copper seed layer.

8. The substrate according to claim 7, wherein a semiconductor wafer is used as a base.

9. The substrate according to claim 1, additionally comprising a damascene wiring having via trenches with a wiring width of no greater than 50 nm formed in the base and a copper seed layer provided on the alloy film.

10. A method of forming a substrate comprising an alloy film provided on a base, the method comprising the step of forming the alloy film of a thickness of from 0.5-5 nm by chemical vapor deposition on the base, the alloy film comprising at least one metal having a barrier function and at least one metal having a catalytic ability with respect to electroless plating, the at least one metal having a barrier function being selected from the group consisting of tungsten, molybdenum and niobium and the at least one metal having a catalytic ability being selected from the group consisting of ruthenium and platinum and the content of the at least one metal having a barrier function in the alloy film is 5-90 at. %.

* * * * *